United States Patent [19]
Chien et al.

[11] Patent Number: 5,945,254
[45] Date of Patent: Aug. 31, 1999

[54] FABRICATION PROCESS FOR MULTICHIP MODULES USING LOW TEMPERATURE BAKE AND CURE

[75] Inventors: Chung-Ping Chien, Redmond; Jean A. Nielsen, Kent; Peter L. Young, Mercer Island, all of Wash.

[73] Assignee: The Boeing Company

[21] Appl. No.: 08/768,599

[22] Filed: Dec. 18, 1996

[51] Int. Cl.$^6$ ................... G03C 5/58; G03F 7/40
[52] U.S. Cl. ............ 430/296; 430/312; 430/313; 430/314; 430/316; 430/318
[58] Field of Search .............. 430/296, 311, 430/312, 313, 314, 316, 318

[56] References Cited

U.S. PATENT DOCUMENTS

| | | | |
|---|---|---|---|
| 4,826,756 | 5/1989 | Orvek | 430/328 |
| 5,122,439 | 6/1992 | Miersch et al. | 430/311 |
| 5,122,440 | 6/1992 | Chien | 430/315 |
| 5,124,238 | 6/1992 | Chakrauorty et al. | 430/330 |
| 5,173,392 | 12/1992 | Miersch et al. | 430/311 |
| 5,212,050 | 5/1993 | Mier et al. | 430/320 |
| 5,300,403 | 4/1994 | Angelopolus et al. | 430/325 |
| 5,306,670 | 4/1994 | Mowatt et al. | 437/209 |
| 5,310,625 | 5/1994 | Angelopoulos et al. | 430/325 |
| 5,370,974 | 12/1994 | Agostino et al. | 430/325 |
| 5,432,677 | 7/1995 | Mowatt et al. | 361/719 |

OTHER PUBLICATIONS

Bartlett, Charles J., et. al. "Multichip Packaging Design for VLSI–Based Systems", Dec. 1987, pp. 647–653, IEEE Transactions on Components, Hybrids, and Manufacturing Technology Society.

Johnson, Robert R. "Multichip modules: next–generation packages", Mar. 1990, pp. 34–48, IEEE Spectrum.

Hagge, John K. "Ultra–Reliable Packaging for Silicon On–Silicon WSI", May 1988, pp. 282–292, 38th Electronic Components Conference, Los Angeles, CA.

Frye, Donald C., et. al. "Cost Implications of Large Area MCM Processing", Apr. 1994, pp. 69–80, MCM '94 Proceedings, International Conference and Exhibition, Multichip Modules, Denver, CO.

Palmer, David W., et. al. "From Display and PWB to MCMs: Large Panel Manufacturing", Apr. 1994, pp. 81–85, MCM '94 Proceedings, International Conference and Exhibition, Multichip Modules, Denver, CO.

Trask, Philip A., et. al. "Large Format MCM–D Processing", Apr. 1994, pp. 94–99, MCM '94 Proceedings, International Conference and Exhibition, Multichip Modules, Denver, CO.

White, George E. et. al. "Large Format Fabrication A Practical Approach to Low Cost MCM–D", Apr. 1994, pp. 86–93, MCM '94 Proceedings, International Conference and Exhibition, Multichip Modules, Denver, CO.

*Primary Examiner*—Christopher G. Young
*Attorney, Agent, or Firm*—Thomas W. Hennen

[57] ABSTRACT

A method for manufacturing a multichip module deposited substrate board utilizing alternating layers of high density thin-film metal and either preimidized or non-preimidized organic polymer insulating material wherein the insulating material is cured during manufacture using either ultraviolet radiation, ion beam radiation or electron beam radiation. This method eliminates subjecting the in-process substrate board to temperatures in excess of the recrystalization temperature of the thin-film metal, thereby eliminating the source of warpage and metal interdiffusion and corrosion at the metal to insulating material interface. This process enables successful manufacture of large format multichip module deposited substrate boards in sizes up to approximately 24 inches square.

21 Claims, 2 Drawing Sheets

FABRICATION PROCESS FOR MULTICHIP MODULES USING LOW TEMPERATURE BAKE AND CURE

BACKGROUND OF THE INVENTION

1. Field of the Invention

The present invention relates to the electronics manufacturing art and, in particular, to a method for manufacturing multichip module deposited substrate boards in large format while minimizing warpage and metal interdiffusion and corrosion at the metal to insulating material interface. With greatest particularity, the present invention relates to a low cost, low temperature, low stress method for manufacturing large format multichip module deposited substrate boards.

2. Background Information

As electronic device technologies have developed and evolved, the trend has been to ever greater levels of electronic circuit complexity and miniaturization. The rapid progress made in very large scale integration (VLSI) technology has led to integrated circuits (IC) with finer features, increased I/O pin count, greater speed and functionality, and higher power dissipation. Silicon emitter coupled logic (ECL) chips used in high performance workstations, mainframe computers, and in several supercomputers have been running with clock rates of 250 MHz. Gallium Arsenide (GaAs) VLSI and large scale integration (LSI) chips capable of operating in the GHz regime are becoming more widely available. These advances have pushed the performance of standard single-chip surface-mount and through-hole packaging technology beyond their limits.

Multichip modules (MCM), which offer shorter interconnects with controlled impedance and high wiring density to connect multiple bare die on a single substrate, have been proposed as the technology of next generation packaging. MCM-D, which is fabricated with alternating deposited layers of high density thin-film metals and low dielectric constant insulating materials, is especially suited to meet both high packing density requirements and high speed performance. MCM-D allows semiconductor die to be placed very close together to minimize delays between chips, decrease packaging capacitance and inductance [1] thus, simplifying power distribution [2]. Furthermore, with proper selection of a high heat transfer material as the substrate, MCM-D promises to enhance thermal management [2], and to improve reliability [3].

An MCM-D substrate typically consists of five metal levels: a ground plane, a power plane, two signal conductor layers, and a terminal metal layer. The intermetal dielectric materials used are organic polymer, such as polyimides, polyquinoline, triazine, and BCB (bisbenzocyclobutenes). The most common of these is polyimide, which because of its low dielectric constant (~3.1), excellent processing characteristics, and extreme resistance to temperature and chemical etchants, is a natural choice. Popular substrate materials are ceramics, silicon wafers, aluminum nitride and metals. Copper is the conductor material of choice because of its high electrical conductivity. However, very thin interface materials such as chromium, titanium, or a combination of titanium (for adhesion) and tungsten (as a barrier layer) are used to promote adhesion of copper to polyimide.

The typical fabrication approach consists of sequential deposition and patterning of conductor and dielectric materials on rigid substrates using semiconductor thin film techniques. Polyimide is applied by spin, spray or extrusion coating, and vias are defined by either reactive ion etching or a photo-imaging process. Copper is usually sputtered or plated and patterned photolithographically. By constructing MCM-D products with semiconductor processing techniques, the manufacturer can employ photolithography manufacturing processes to achieve the maximum high density interconnection (HDI). However, due to its inherent higher processing cost, MCM-D continues to remain as the packaging solution only for high-end applications. While the perceived economic constraints have inhibited widespread use of MCM-D in today's marketplace, the ability to manufacture MCM-D in large format has been extensively studied and considered as the approach to meet the future performance challenges and be cost effective [4–7].

Even though large format fabrication is promising as an approach to low cost MCM-D, there are a number of technical difficulties which must be overcome to achieve reasonable manufacturing yield. One of the largest problems is stress induced substrate warpage. In the current copper/polyimide MCM-D fabrication process, the deposited polyimide requires a final cure at 400° C. for one hour to achieve its maximum chemical stability. During the high temperature annealing step, the deposited low stress copper conductor will recrystallize resulting in relief of residual intrinsic stress introduced during the sputtering process. The elevated temperature provides the molecules with the kinetic energy required for relocation to their lowest energy position. The overall MCM-D stress drastically increases when the substrate returns to room temperature due to greater influence of the lattice mismatch between the substrate and the copper film because of the formation of long range crystal structure (the original film is basically amorphous). This phenomenon is illustrated in FIG. 1. This phenomenon repeats itself with the addition of each thin-film metal layer in the manufacturing process.

FIG. 1 shows the stress level of the copper conductor increases more than 250 times after a short one minute bake at 390° C. Heat induced stress and coefficient of thermal expansion (CTE) mismatch between copper, polyimide and substrate material will cause the substrate to warp. As the MCM-D substrate size (area) increases, the substrate warpage problem becomes more severe, and leads to a multitude of problems in processing areas such as photolithographic alignment, substrate handling, film thickness uniformity in deposition and etching.

In particular, photolithographic processes can only tolerate a certain amount of substrate warpage before it becomes impossible to pattern the thin-film metal layer accurately because the warped surface no longer resides uniformly within a suitably thin focal zone (plane) and some image features will unavoidably be out of focus at some locations. For this reason, a perfectly flat substrate is ideal, and manufacturers should seek to minimize deviation from that flat substrate surface.

In addition, the high temperature curing will promote the metal interdiffusion and corrosion at the metal-polyimide interface that may adversely affect the product reliability. Furthermore, the currently proposed high temperature MCM-D fabrication process threatens to inhibit or discourage the MCM-D manufacturers from using low cost laminated substrates, and may thereby cause them to lose the competitive edge.

Therefore, it is essential to have a low temperature, low stress, and low cost approach to successfully fabricate the MCM-D in large format, e.g., 24"×24" panels.

SUMMARY OF THE INVENTION

The present invention solves this high temperature induced warpage problem by providing a process for fabrication of low cost, large format MCM-Ds at low temperature, with minimal stress. This invention proposes to construct a large format copper/polyimide multilayer structure on an MCM-D substrate by substituting a low temperature, radiation induced curing and crosslinking of the polyimide layers step in place of the conventional high temperature cure step that unavoidably results in thin-film metal recrystallization and consequent warpage of the MCM-D substrate as it cools. In particular, the inventors have found that ultraviolet light, ion beam radiation and electron beam radiation are three suitable methods of curing and crosslinking the insulating layers (usually polyimide) while maintaining substrate temperature below the recrystallization temperature of the thin-film metal layers (usually copper) in a large format multichip module deposited substrate board. An additional benefit of using the present invention is that metal interdiffusion and corrosion at the metal to insulating material interface is greatly diminished or eliminated by using a low temperature radiation cure instead of a conventional high temperature cure.

BRIEF DESCRIPTION OF THE DRAWING(S)

These and other features of the present invention will be explained in further detail in the following detailed description and with reference to the following drawing figures, wherein:

FIG. 1 illustrates a plot of the stress level of a copper conductor as a function of temperature; and FIG. 2 illustrates one molecular representation of the polyimide crosslinking phenomenon.

DESCRIPTION OF A PREFERRED EMBODIMENT

The present invention is a manufacturing process that uses a radiation cure and crosslinking step in a multichip module deposited substrate manufacturing process to cure and crosslink the insulating material to achieve a low cost, low temperature, low stress method for manufacturing large format multichip module deposited substrate boards. In this context, "large format" refers to multichip modules having surface areas up to approximately 24 inches by 24 inches square.

In performing the method of this invention, the inventors have found that use of preimidized polyimide that has undergone a certain degree of cross-linking prior to application is advantageous. Preimidized polyimide has short chain molecular bonds. One of the advantages of the preimidized polyimide, for the present application, is that it is inherently photosensitive. The polyimide will crosslink further upon exposure to UV light. This helps shorten the processing time, since a separate photoresist masking process and etch step does not have to be used.

Non-preimidized polyimide, as the name suggests, has not undergone preimidization. Therefore, there is no cross-linking prior to application. Using such non-preimidized polyimide may require the addition of a photosensitizer and longer processing times.

The pre-bake is intended to drive off solvent dissolved in the polyimide. The reason the solvent is in the polyimide to begin with, is that the polyimide is applied as a liquid (in a solvent base) and polymerized in place. The bake removes 90% of the solvents in preimidized polyimide, but only 50% of the solvents in the non-preimidized. To the best of the inventors' knowledge, a 100 degree C. bake for 30–40 minutes will drive out 90% of the solvents (preimidized).

The time and temperature recommended for the bake step was obtained from the polyimide vendor (Olin/Ciba-Geigy).

An insulating material having a low dielectric constant is considered better for the MCM-D application for several reasons. First, in this context, the dielectric constant is defined as "the ratio of the permittivity of a substance to the permittivity of free space". A lower dielectric constant, resulting in faster propagation times, is a favored approach for yielding a higher performance device.

Figure 1:
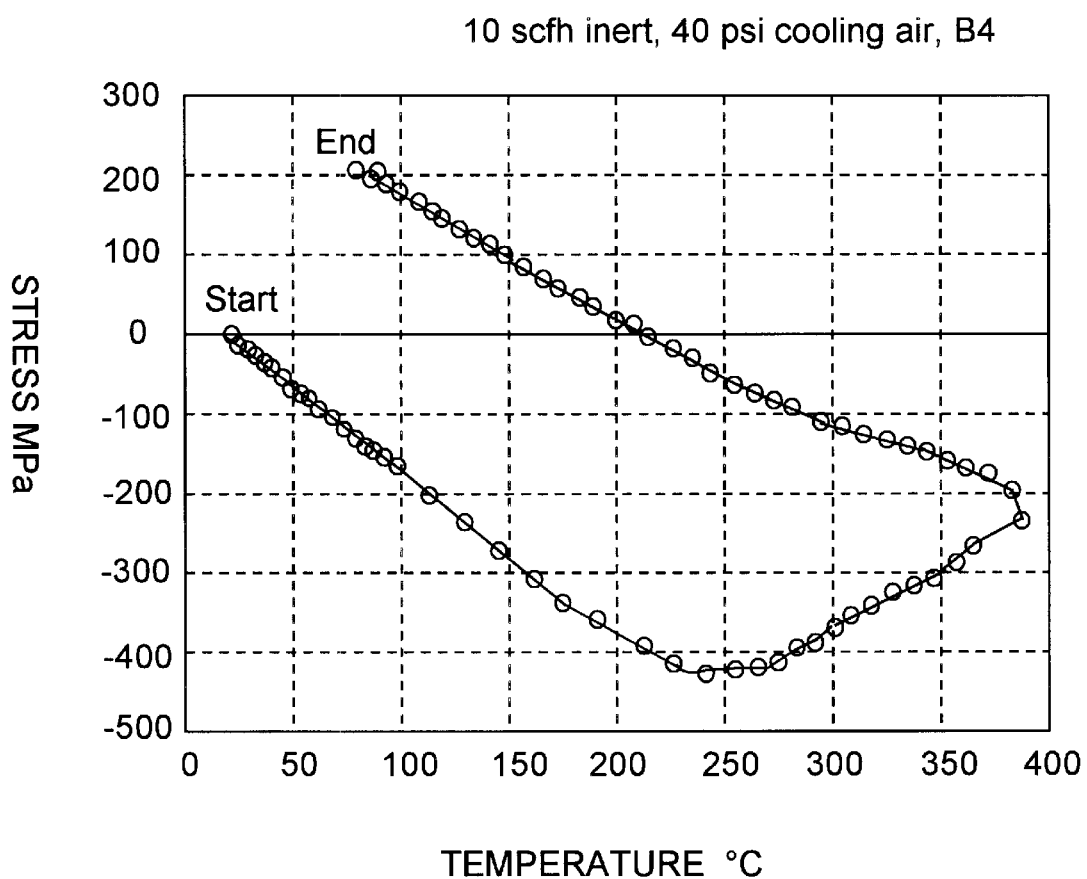
Figure 2:
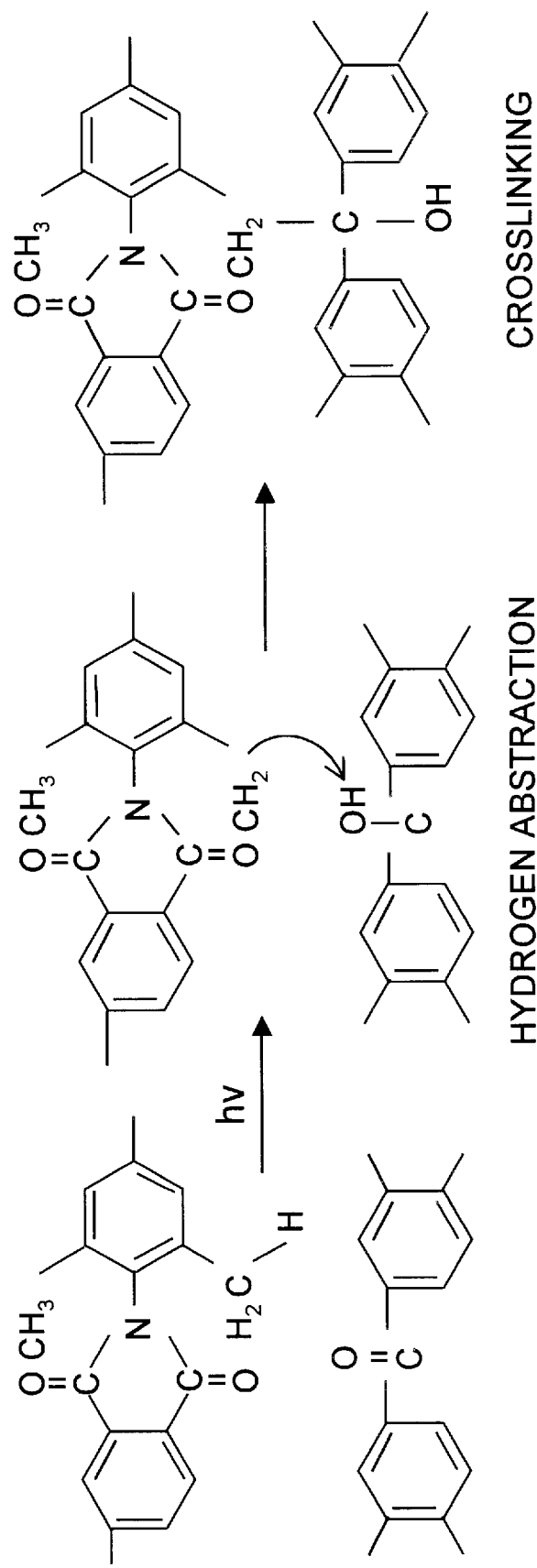

OCG Probimide 400 is a preimidized photosensitive polyimide obtained by condensation polymerization of benzophenone tetracarboxylic acid dianhydride with diamine in which the alkyl group was substituted in the ortho position [10] and [11]. This material is intrinsically photosensitive and does not require a photopolymerization initiator. The image forming mechanism involves a crosslinked structure by coupling of ketyl radicals and ortho-alkyl radicals generated when the excited triple state of benzophenone extracts hydrogen from the alkyl group as shown in FIG. 2. This renders the material insoluble.

To process the photosensitive polyimide, typically the first step is spin coating for depositing polyimide precursor solutions on to silicon wafers. Then, the next step in the process is the drying step, also referred to as the soft-bake, or prebake step. The objectives of the drying step are to remove residual solvents from the coating so that the substrate can be handled during subsequent processing without altering the coating, and to increase adhesion of the coating to the substrate. Excess solvent in the coating can adversely affect both the exposure and the subsequent developing steps in the patterning process. The parameters that must be considered to ensure correct drying include the solvent composition, vapor pressure, and boiling point; the polymer composition and molecular weight; the solution concentration; the glass transition temperature of the polymer/solvent mixture; the temperature at which the precursor begins to imidize if a non-preimidized polyimide precursor is in process; the thermal stability of the components of the precursor system; the time, temperature, and drying rate; and the environmental conditions (e.g., relative humidity, exhaust flow rate, etc.).

After the UV exposure and developing step, the last step in the polyimide photo-patterning process is the cure, also referred to as the postbake. The cure conditions play a critical role in controlling the morphology of the cured polyimide structure, which in turn dictates the final properties. The objectives of the cure step are the removal of any residual solvents and to complete the conversion of precursor into the polyimide if a non-preimidized polyimide is in process, and, in the case of non-intrinsic photosensitive polyimides, to complete the removal of the photoinitiator system. Thus, due to the removal of the photoinitiator, typically photosensitive polyimide film thickness will be reduced by about 50% after the final cure as compared to around 10% for preimidized intrinsic photosensitive polyimide, such as OCG Probimide 400. In addition, this final cure step (typically around 400° C.) also enhances a higher degree of crosslinking, thus, resulting in a longer molecular chain and better solvent resistance.

As will be seen below, the present method is adapted for use with either a preimidized dielectric insulator or a non-preimidized dielectric insulator. The two adaptations of the present method, one for preimidized dielectric insulator, and one for non-preimidized dielectric insulator, are as follows:
(a) Preimidized Polyimide as the Dielectric Insulator A layer of preimidized polyimide is coated onto the substrate by spin, spray or extrusion technique, as is well known. After a soft bake step at around 100° C. for approximately 30–40 minutes as recommended by the polyimide manufacturer to remove the excess solvent, the polyimide layer is photolithographically patterned in a known manner. Then, instead of a thermal cure at an elevated temperature of about 400° C., the patterned preimidized polyimide layer is cured and crosslinked by irradiating it with a dosage of ultraviolet [8], ion beam or electron beam [9] radiation. The copper conductor is deposited by sputtering or electroplating technique and patterned by a photolithographic process. A copper/polyimide multilayer structure is constructed by repeating the procedures as stated above.

(b) Non-preimidized Polyimide as the Dielectric Insulator

A layer of non-preimidized polyimide is coated onto the substrate by spin, spray or extrusion method, followed by a soft bake at around 100° C. in a convection oven for 20–30 minutes to remove the excess solvent from the film. The polyimide film is then cured and crosslinked by irradiating it with a dosage of ultraviolet, ion beam or electron beam radiation. Further details of the irradiation process are available in references [8] and [9]. The polyimide layer is patterned by reactive ion beam etching with photoresist or with some other suitable material as the etch mask as is well known. The copper conductor is sputtered or electroplated and patterned photolithographically, again in a conventional manner. By repeating the procedures stated above, a copper/polyimide MCM structure is established.

Advantages of the Present Invention to Large Format MCM-D Manufacturing

All our current data confirms that a multilayer copper/polyimide interconnect MCM structure can be constructed with zero or minimal overall residual stress by alleviating the high temperature polyimide annealing step. Thus, our invention offers a viable solution for MCM-D to become cost competitive by manufacturing modules in very large format. The advantages of the present invention to large format MCM-D manufacturing are summarized as follows:

The low temperature, low stress approach will allow the manufacturer to use laminates and other very low cost substrates.

The zero or minimal substrate warpage will alleviate the very stringent requirements imposed on all the large format processing equipment Thus, the MCM-D manufacturers can readily adopt equipment developed for the flat panel industry, and drastically decrease initial capital investment.

The low temperature approach also minimizes metal interdiffusion and corrosion at the copper/polyimide interface, and thus enhances the system reliability.

Further information regarding the teachings of this specification may be found in the following references, referenced by bracketed number throughout the specification. Item [8] on this list, C. P. Chien, "*Ultraviolet Curing of Photosensitive Polyimides,*" U.S. Pat. No. 5,122,440, is specifically incorporated herein by this reference:

[1] C. J. Bartlett, J. M. Segelken, and N. A. Teneketges, "Multichip Packaging Design For VLSI-Based System," IEEE Trans. CHMT, vol. 12, pp. 647–653, December 1987.

[2] R. Johnson, "*Multichip Modules: Next-Generation Packages,*" IEEE Spectrum, pp. 34–48, 1990.

[3] J. Hagge, "*Ultra-reliable Packaging For Silicon-On-Silicon WSI,*" Proc. of the 38th Electron. Components Conf., pp. 190–200, 1988.

[4] D. C. Frye, M. P. Skinner, R. H. Heistand II, P. E. Garrou, and T. G. Tessier, "*Cost Implications of Large Area MCM Processing,*" Proc. of the 1994 International Conf. On Multichip Modules, pp. 69–80, Denver, Colo., April 1994.

[5] D. W. Palmer and W. Worobey, "*From Display and PWB To MCMs: Large Panel Manufacturing,*" Proc. of the 1994 International Conf. On Multichip Modules, pp. 81–85, Denver, Colo., April 1994.

[6] G. E. White, E. Perfecto, T. DeMercurio, D. McHerron, T. Redmond, and M. Norcott, "*Large Format Fabrication, A Practical Approach To Low Cost MCM-D,*" Proc. of the 1994 International Conf. On Multichip Modules, pp. 86–93, Denver, Colo., April 1994.

[7] P. A. Trask and V. A. Pillai, "Adaptation of the Hughes HDMI™ Process To Large Format MEM-D: Options, Results To Date," Proc. of the 1994 International Conf. On Multichip Modules, pp. 94–99, Denver, Colo., April 1994.

[8] C. P. Chien, "*Ultraviolet Curing of Photosensitive Polyimides,*" U.S. Pat. No. 5,122,440.

[9] M. Zumbrum, G. Wilkes, T. Ward, "Characterization of the Dynamic Mechanical and Dielectric Properties of UV- and EB-Cured Coatings," *Proceedings of the* 1993 *Radiat. Curing Polym. Sci. Technol.*, Volume 3, pp. 101–151, Schenectady, New York, 1993, Published by Elsevier, London, UK.

[10] Rhode, O., Smolka, P., Falcigno, P., *Polymer Engineering and Science*, Vol. 32, #21, Mid-November, 1992, pp. 1623 "Novel Auto-Photosensitive Polyimides with Tailored Properties."

[11] Lin, A., Sastri, V., Tesoro, G., Reiser, A., *Macromolecules*, Vol. 21, 1988, pp. 1165, "On the Cross-Linking Mechanism of Benzophenone- Containing Polyimides."

In summary, a method for manufacturing a large format, low stress, low cost, low temperature multichip module deposited substrate board utilizing alternating layers of high density thin film metal and organic polymer insulating material has been disclosed. While the preferred embodiment of the invention has been described in detail, it should be understood that many modifications and variations thereto are possible, all of which fall within the true spirit and scope of the invention.

What is claimed is:

1. A method for manufacturing a multichip module deposited substrate board utilizing alternating layers of preimidized insulating material and high density thin film metal, comprising:

a) providing a suitable substrate;

b) coating said substrate with a layer of preimidized insulating material;

c) baking said layer of preimidized insulating material at a temperature below the recrystalization temperature of said high density thin film metal for a time sufficient to remove dissolved solvent within said preimidized insulating material;

d) photolithographically patterning said layer of preimidized insulating material;

e) curing and crosslinking said layer of preimidized insulating material using radiation, while maintaining the temperature of said layer of preimidized insulating material below the recrystalization temperature of said high density thin film metal;

f) depositing a high density thin film metal layer upon said layer of preimidized insulating material;

g) photolithographically patterning said high density thin film metal layer; and h) repeating steps b) through g) until the multichip module deposited substrate board is completed.

2. A method for manufacturing a multichip module deposited substrate board as set forth in claim 1, wherein said coating step comprises a spin coating step.

3. A method for manufacturing a multichip module deposited substrate board as set forth in claim 1, wherein said coating step comprises a spray coating step.

4. A method for manufacturing a multichip module deposited substrate board as set forth in claim 1, wherein said coating step comprises an extrusion coating step.

5. A method for manufacturing a multichip module deposited substrate board as set forth in claim 1, wherein said curing and crosslinking step comprises irradiating said layer of preimidized insulating material with ultraviolet radiation.

6. A method for manufacturing a multichip module deposited substrate board as set forth in claim 1, wherein said curing and crosslinking step comprises irradiating said layer of preimidized insulating material with ion beam radiation.

7. A method for manufacturing a multichip module deposited substrate board as set forth in claim 1, wherein said curing and crosslinking step comprises irradiating said layer of preimidized insulating material with electron beam radiation.

8. A method for manufacturing a multichip module deposited substrate board as set forth in claim 1, wherein said depositing step comprises a sputtering step.

9. A method for manufacturing a multichip module deposited substrate board as set forth in claim 1, wherein said depositing step comprises an electroplating step.

10. A method for manufacturing a multichip module deposited substrate board as set forth in claim 1, wherein said preimidized insulating material comprises a polyimide and said high density thin film metal layer comprises copper.

11. A method for manufacturing a multichip module deposited substrate board utilizing alternating layers of non-preimidized insulating material and high density thin film metal, comprising:
   a) providing a suitable substrate;
   b) coating said substrate with a layer of non-preimidized insulating material;
   c) baking said layer of non-preimidized insulating material at a temperature below the recrystalization temperature of said high density thin film metal for a time sufficient to remove dissolved solvent within said non-preimidized insulating material;
   d) curing and crosslinking said layer of non-preimidized insulating material using radiation while maintaining the temperature of said layer of non-preimidized insulating material below the recrystalization temperature of said high density thin film metal;
   e) patterning said cured and crosslinked layer of non-preimidized insulating material by a reactive ion beam etching process using an etch mask;
   f) depositing a high density thin film metal layer upon said layer of non-preimidized insulating material;
   g) photolithographically patterning said high density thin film metal layer; and
   h) repeating steps b) through g) until the multichip module deposited substrate board is completed.

12. A method for manufacturing a multichip module deposited substrate board as set forth in claim 11, wherein said coating step comprises a spin coating step.

13. A method for manufacturing a multichip module deposited substrate board as set forth in claim 11, wherein said coating step comprises a spray coating step.

14. A method for manufacturing a multichip module deposited substrate board as set forth in claim 11, wherein said coating step comprises an extrusion coating step.

15. A method for manufacturing a multichip module deposited substrate board as set forth in claim 11, wherein said curing and crosslinking step comprises irradiating said layer of non-preimidized insulating material with ultraviolet radiation.

16. A method for manufacturing a multichip module deposited substrate board as set forth in claim 11, wherein said curing and crosslinking step comprises irradiating said layer of non-preimidized insulating material with ion beam radiation.

17. A method for manufacturing a multichip module deposited substrate board as set forth in claim 11, wherein said curing and crosslinking step comprises irradiating said layer of non-preimidized insulating material with electron beam radiation.

18. A method for manufacturing a multichip module deposited substrate board as set forth in claim 11, wherein said depositing step comprises a sputtering step.

19. A method for manufacturing a multichip module deposited substrate board as set forth in claim 11, wherein said depositing step comprises an electroplating step.

20. A method for manufacturing a multichip module deposited substrate board as set forth in claim 11, wherein said non-preimidized insulating material comprises a polyimide and said high density thin film metal layer comprises copper.

21. A method for manufacturing a multichip module deposited substrate board as set forth in claim 11, wherein said patterning step uses a photoresist etch mask.

* * * * *